(12) United States Patent
Reichman et al.

(10) Patent No.: US 11,335,643 B2
(45) Date of Patent: May 17, 2022

(54) EMBEDDED BALL LAND SUBSTRATE, SEMICONDUCTOR PACKAGE, AND MANUFACTURING METHODS

(71) Applicant: Amkor Technology Singapore Holding Pte. Ltd., Singapore (SG)

(72) Inventors: Corey Reichman, Mesa, AZ (US); Ronald Huemoeller, Gilbert, AZ (US)

(73) Assignee: AMKOR TECHNOLOGY SINGAPORE HOLDING PTE. LTD., Singapore (SG)

( * ) Notice: Subject to any disclaimer, the term of this patent is extended or adjusted under 35 U.S.C. 154(b) by 0 days.

(21) Appl. No.: 17/080,055

(22) Filed: Oct. 26, 2020

(65) Prior Publication Data

US 2021/0043578 A1 Feb. 11, 2021

Related U.S. Application Data

(63) Continuation of application No. 15/943,097, filed on Apr. 2, 2018, now Pat. No. 10,818,602.

(51) Int. Cl.
*H01L 21/56* (2006.01)
*H01L 23/538* (2006.01)
(Continued)

(52) U.S. Cl.
CPC ...... *H01L 23/5389* (2013.01); *H01L 21/4853* (2013.01); *H01L 21/565* (2013.01);
(Continued)

(58) Field of Classification Search
CPC ............. H01L 21/4853; H01L 21/4857; H01L 21/486; H01L 23/32; H01L 23/3114; H01L 23/3128; H01L 23/3107–315; H01L 23/49816; H01L 23/5386; H01L 23/562; H01L 23/5389; H01L 24/10–17; H01L 24/14; H01L 24/16; H01L 24/19; H01L 24/20; H01L 24/32; H01L 2224/214;
(Continued)

(56) References Cited

U.S. PATENT DOCUMENTS 6,353,267 B1 3/2002 Ohuchi et al.
6,717,245 B1 4/2004 Kinsman et al.
(Continued)

FOREIGN PATENT DOCUMENTS

KR 10-2010-0078960 7/2010

*Primary Examiner* — Eric A. Ward
(74) *Attorney, Agent, or Firm* — McAndrews, Held & Malloy, Ltd.

(57) ABSTRACT

A electronic device includes an embedded ball land substrate and a semiconductor die. The embedded ball land substrate includes a top surface, a bottom surface opposite the top surface, and one or more side surfaces adjacent the top surface and the bottom surface. The embedded ball land substrate further includes a mold layer on the bottom surface, contact pads on the top surface, and ball lands embedded in the mold layer and electrically connected to the contact pads. The semiconductor die includes a first surface, a second surface opposite the first surface, one or more side surfaces adjacent the first surface and the second surface, and attachment structures along the second surface. The semiconductor die is operatively coupled to the contact pads via the attachment structures.

20 Claims, 10 Drawing Sheets

(51) Int. Cl.
  *H01L 21/66* (2006.01)
  *H01L 23/31* (2006.01)
  *H01L 23/00* (2006.01)
  *H01L 21/48* (2006.01)
  *G01R 31/28* (2006.01)

(52) U.S. Cl.
  CPC .............. *H01L 22/14* (2013.01); *H01L 22/32* (2013.01); *H01L 23/3114* (2013.01); *H01L 23/3128* (2013.01); *H01L 23/5386* (2013.01); *H01L 23/562* (2013.01); *H01L 24/19* (2013.01); *H01L 24/20* (2013.01); *G01R 31/2831* (2013.01); *H01L 2224/214* (2013.01); *H01L 2924/3511* (2013.01)

(58) Field of Classification Search
  CPC ....... H01L 2224/32225; H01L 2224/97; H01L 2224/16225; H01L 2224/131; H01L 2224/13111; H01L 2224/16227; H01L 2224/73204; H01L 2224/81–8111; H01L 2924/181; H01L 2924/014; H01L 2924/15311; H01L 2924/3511; G01R 31/2831
  See application file for complete search history.

(56) References Cited

U.S. PATENT DOCUMENTS

| | | |
|---|---|---|
| 7,141,873 B2 | 11/2006 | Aoyagi |
| 7,262,080 B2 | 8/2007 | Go et al. |
| 7,642,133 B2 | 1/2010 | Wu et al. |
| 7,714,453 B2 | 5/2010 | Khan et al. |
| 8,222,538 B1 | 7/2012 | Yoshida et al. |
| 8,436,255 B2 | 5/2013 | Goh |
| 2002/0135057 A1 | 9/2002 | Kurita |
| 2006/0012037 A1 | 1/2006 | Raedt et al. |
| 2009/0242245 A1* | 10/2009 | Asano ................ H01L 23/49833 174/255 |
| 2010/0164101 A1 | 7/2010 | Lee et al. |
| 2010/0219521 A1 | 9/2010 | Lee et al. |
| 2011/0243118 A1 | 10/2011 | Kezys et al. |
| 2013/0105063 A1 | 5/2013 | Dauksher et al. |
| 2013/0181342 A1 | 7/2013 | Park |
| 2016/0035659 A1 | 2/2016 | Nah et al. |
| 2016/0056079 A1 | 2/2016 | Kim et al. |
| 2016/0284657 A1 | 9/2016 | Han et al. |
| 2016/0366762 A1* | 12/2016 | Lin ........................ H01L 25/065 |
| 2018/0040572 A1* | 2/2018 | Haba .................. H01L 23/5383 |
| 2018/0277492 A1 | 9/2018 | Li et al. |

\* cited by examiner

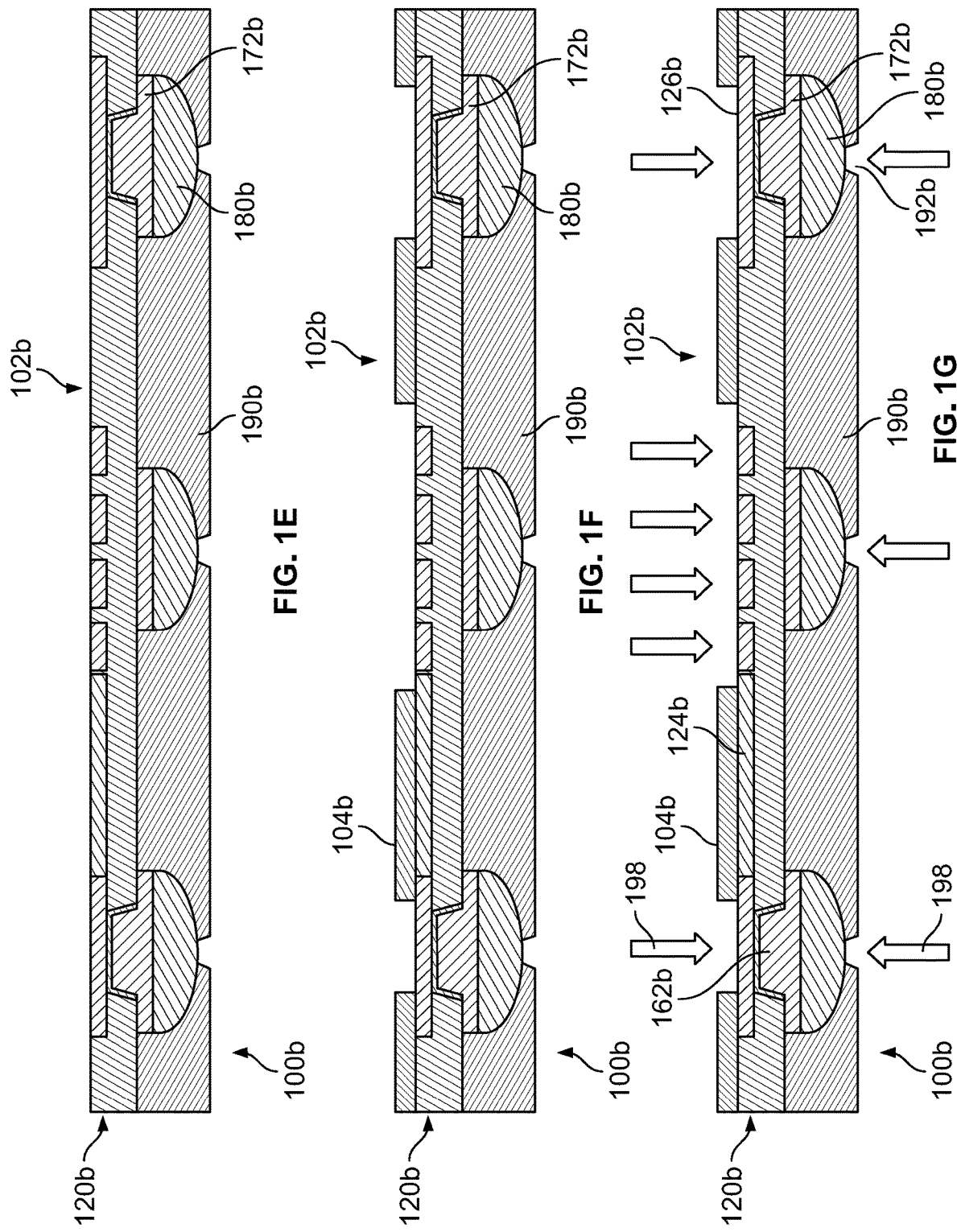

EMBEDDED BALL LAND SUBSTRATE, SEMICONDUCTOR PACKAGE, AND MANUFACTURING METHODS

FIELD OF THE DISCLOSURE

Various aspects of the present disclosure relate to semiconductor packages, substrates for semiconductor packages, and manufacturing methods thereof.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

Common reference numerals are used throughout the drawings and the detailed description to indicate the same and/or similar elements.

FIGS. 1A-1G provide cross-sectional views of an electronic device fabricated in accordance with an example fabrication process of the present disclosure.

DETAILED DESCRIPTION

Figure 1A:
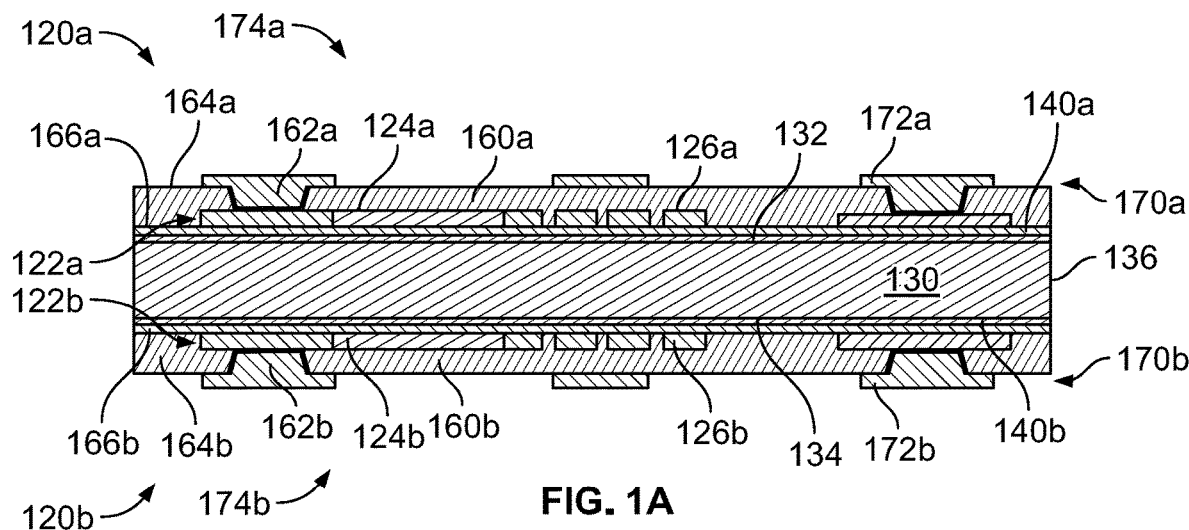

Various aspects of the present disclosure can be embodied in many different forms and should not be construed as being limited to the example embodiments set forth herein. Rather, these example embodiments of the disclosure are provided so that this disclosure will be thorough and complete and will convey various aspects of the disclosure to those skilled in the art.

According to various embodiments of the present disclosure, an embedded ball land substrate includes a coreless substrate. The coreless substrate includes a top surface, a bottom surface opposite the top surface, and one or more side surfaces adjacent the top surface and the bottom surface. The embedded ball land substrate further includes contact pads on the top surface of the coreless substrate, and ball lands on the bottom surface of coreless substrate. The ball lands are electrically connected to the contact pads via the coreless substrate. The embedded ball land substrate also includes a mold layer on the bottom surface of the coreless substrate. The mold layer encapsulates the ball lands.

According to further embodiments of the present disclosure, a semiconductor device includes a coreless substrate, a mold layer, and a semiconductor die. The coreless substrate includes a top surface, a bottom surface opposite the top surface, and one or more side surfaces adjacent the top surface and the bottom surface. The coreless substrate further includes contact pads on the top surface and ball lands on the bottom surface. The ball lands are electrically connected to the contact pads. The mold layer includes mold compound that covers the bottom surface of the coreless substrate and side surfaces of the plurality of ball lands. The mold compound reduces warpage of the coreless substrate. The semiconductor die includes a first surface, a second surface opposite the first surface, side surfaces adjacent the first surface and the second surface, and attachment structures along the second surface. The semiconductor die is operatively coupled to the contact pads via the attachment structures.

According to yet other embodiments of the present disclosure, a method of fabricating a semiconductor device includes attaching a semiconductor die to contact pads on a first surface of an embedded ball land substrate having ball lands on a second surface that are encapsulated in mold compound of a mold layer. The method further includes forming an encapsulant over the semiconductor die and the first surface of the embedded ball land substrate. The method also includes planarizing the mold layer to gain access to the ball lands. After said planarizing, the method further includes attaching conductive balls to the ball lands.

In the drawings, the thickness of layers and regions are exaggerated for clarity. Here, like reference numerals refer to like elements throughout. As used herein, the term "and/or" includes any and all combinations of one or more of the associated listed items. It will also be understood that when an element A is referred to as being "connected to" an element B, the element A can be directly connected to the element B or an intervening element C can be present and the element A and the element B are indirectly connected to each other.

The terminology used herein is for the purpose of describing particular embodiments only and is not intended to be limiting of the disclosure. As used herein, the singular forms are intended to include the plural forms as well, unless the context clearly indicates otherwise. It will be further understood that the terms "comprise, include" and/or "comprising, including," when used in this specification, specify the presence of stated features, numbers, steps, operations, elements, and/or components, but do not preclude the presence or addition of one or more other features, numbers, steps, operations, elements, components, and/or groups thereof.

It will be understood that, although the terms first, second, etc. can be used herein to describe various members, elements, regions, layers and/or sections, these members, elements, regions, layers and/or sections should not be limited by these terms. These terms are only used to distinguish one member, element, region, layer and/or section from another. Thus, for example, a first member, a first element, a first region, a first layer and/or a first section discussed below could be termed a second member, a second element, a second region, a second layer and/or a second section without departing from the teachings of the present disclosure.

Spatially relative terms, such as "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device can be otherwise oriented (rotated 90 degrees or at other orientations) and the spatially relative descriptors used herein can be interpreted accordingly.

Furthermore, the term "coplanar" and similar terms are used herein to denote two surfaces that lie within the same plane. Coplanar surfaces can be adjacent or adjoining each other; however non-adjacent and/or non-adjoining surfaces can also be coplanar. For example, a gap, a void, and/or other structures can be interposed between the coplanar surfaces. Furthermore, due to manufacturing tolerances, thermal expansion, and the like, slight deviations can exist in coplanar surfaces. Such deviations can result in one surface being slightly higher than the other surface, thus forming a step-off (e.g., a step-up or step-down) between surfaces. As used herein, the term "coplanar" includes surfaces having a step-off ranging between 0 and 7 microns.

Referring now to FIGS. 1A-1G, cross-sectional views are provided of an embodiment of an embedded ball land substrate 101a, 101b fabricated in accordance with an example fabrication process of the present disclosure.

As shown in FIG. 1A, coreless substrates 120a, 120b can be built-up, layer upon layer, on a carrier 130. The carrier 130 can provide a dummy plate upon which the embedded ball land substrates 100a, 100b can be fabricated. To this end, the carrier 130 can comprise a material such as a metal, a semiconductor wafer, a glass, or other materials suitable for supporting and carrying the embedded ball land substrates 100a, 100b during the fabrication process.

As shown, the carrier 130 can include an upper surface 132, a lower surface 134 opposite the upper surface 132, and side surfaces 136 adjacent the upper and lower surfaces 132, 134. The side surfaces 136 can adjoin the upper surface 132 to the lower surface 134. Moreover, the upper surface 132 can provide a generally planar surface that is parallel to a generally planar surface of the lower surface 134.

An upper or first separation film 140a can be formed on the upper surface 132 of the carrier 130 and a lower or second separation film 140b can be formed on the lower surface 134 of the carrier 130. In some embodiments, each separation film 140a, 140b can utilize a temporary adhesive that loosens when exposed to thermal energy, radiation, and/or chemicals. For example, a temporary adhesive of the separation film 140a, 140b can be subjected to laser (or light) irradiation to effect or assist with the separation or release of the embedded ball land substrates 100a, 100b from the carrier 130. Moreover, in some embodiments, a solvent can be used to remove or loosen an adhesive of the separation film 140a, 140b from the embedded ball land substrates 100a, 100b.

The coreless substrate 120a, 120b can be formed on the separation films 140a, 140b. Each coreless substrate 120a, 120b can provide redistribution structures that can take many different forms such as, for example, an embedded trace substrate, one or more redistribution layers defining one or more tiers, an interposer, etc. However, the coreless substrates 120a, 120b are depicted as a single-tier embedded trace substrate for illustrative purposes.

In order to provide a relatively thin redistribution structure, unlike a printed circuit board (PCB) each coreless substrate 120a, 120b can lack a central reinforcement core, such as a fiberglass layer or other dielectric layer. Instead, the coreless substrate 120a, 120b can be built-up, layer upon layer, upon the separations films 140a, 140a as a stack of alternating conductive layers and dielectric layers. In some embodiments, each coreless substrate 120a, 120b can have a thickness of 5-100 µm, such as between 60-75 µm, and/or approximately 60 µm. For example, a first conductive layer 122a of an upper coreless substrate 120a can be patterned on the upper separation film 140a. Likewise, a first conductive layer 122b of a lower coreless substrate 120b can be patterned on the lower separation film 140b. The first conductive layers 122a, 122b can comprise a patterned conductive material, such as copper, gold, nickel, titanium, a combination of two or more thereof, or other suitable conductive materials.

In some embodiments, the patterning process of the first conductive layers 122a, 122b can include, for example, a Modified Semi-Additive Process (MSAP), or a Semi-Additive Process (SAP) process. Furthermore, the patterning process can form the first conductive layer 122a, 122b such that each first conductive layer 122a, 122b includes a plurality of conductive routing lines or traces 124a, 124b and a plurality of contact pads 126a, 126b. Such contact pads 126a, 126b can provide corresponding locations to which a semiconductor die, conductive pillar, through mold vias, or other electrical interconnect structures can be electrically and physically coupled. The conductive traces 124a, 124b can route, fan-out, fan-in, etc., signals of semiconductor die, conductive pillars, or other electrical interconnect structures attached to the contact pads 126a, 126b.

As shown, each coreless substrate 120a, 120b can further include a dielectric layer 160a, 160b having one or more conductive vias 162a, 162b that extend between a first surface 164a, 164b, and a second surface 166a, 166b opposite the first surface 164, 164. To this end, the upper dielectric layer 160a can be formed over the conductive traces 124a and contact pads 126a of the first conductive layer 122a for the upper coreless substrate 120a, thus embedding the conductive traces 124a and contact pads 126a in the upper dielectric layer 160a. Moreover, the conductive vias 162a can be etched or otherwise formed through the upper dielectric layer 160a.

The lower dielectric layer 160b can be formed similar to the upper dielectric layer 160a. In particular, the lower dielectric layer 160b can be formed over conductive traces 124b and contact pads 126b of the first conductive layer 122b for the lower coreless substrate 120b. Furthermore, the conductive vias 162b can be etched or otherwise formed through the first dielectric layer 160b. In some embodiments, the dielectric layers 160a, 160b include one or more epoxy resins, pre-preg (pre-impregnated fibers), a solder mask, a build-up material, or other suitable insulating materials.

A second conductive layer 170a, 170b can then be patterned over the respective dielectric layer 160a, 160b. Similar to the first conductive layers 122a, 122b, the second conductive layers 170a, 170b can comprise a patterned conductive material, such as copper, gold, nickel, titanium, a combination of two or more thereof, or other suitable conductive materials. The patterning process can form the second conductive layer 170a, 170b such that each second conductive layer 170a, 170b includes a plurality of ball lands 172a, 172b. Moreover, the forming and patterning of the second conductive layers 170a, 170b can fill holes of the conductive vias 162a, 162b with conductive material, thereby electrically connecting the second conductive layer 170a, 170b of each coreless substrate 120a, 120b to its respective first conductive layer 122a, 122b. In some embodiments, the ball lands 172a, 172b can share one or more common layers of material with respective conductive vias 162a, 162b. In other embodiments, holes of the conductive vias 162a, 162b can be filled with conductive material prior to forming and patterning the second conductive layers 170a, 170b and respective ball lands 172a, 172b. In such embodiments, the second conductive layers 170a, 170b can be electrically coupled to its respective first conductive layer 122a, 122b via the conductive material in the vias 162a, 162b.

Furthermore, the patterning can pattern or form each second conductive layer 170a, 170b such that each second conductive layer 170a, 170b includes an array 174a, 174b of ball lands 172a, 172b to which solder balls can be physically attached. In one embodiment, the second conductive layers 170a, 170b can be formed through a plating method using, for example, a mask or plating-prevention pattern, or a similar protective layer.

Figure 1B:
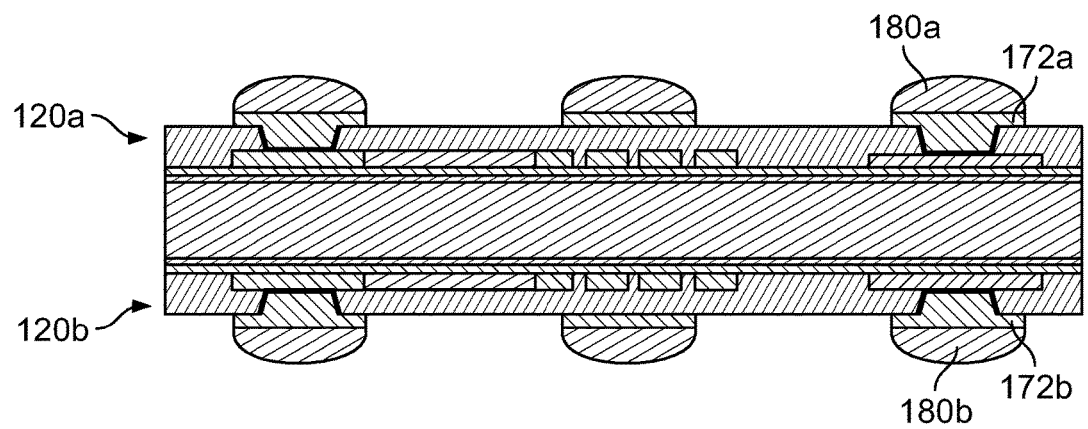

At FIG. 1B, presolder caps 180a, 180b can be formed on each ball land 172a, 172b of the coreless substrate 120a, 120b. In particular, the presolder caps 180a, 180b can be formed such that a separate and distinct presolder cap 180a, 180b is attached to each ball land 172a, 172b. Presolder caps 180a, 180b can be referred as a solder-on-pad (SOP) layer in some examples, and/or can comprise a layer of conductive material such as solder paste with SAC 305 (Sn96.5, Ag3, Cu0.5), or SAC 405 (Sn95.5, Ag4, Cu0.5), among others. In some embodiments, each presolder cap 180a, 180b can have a thickness of 40-100 μm, such as approximately 40 μm. Moreover, in some embodiments, the embedded ball land substrates 100a, 100b can be implemented without presolder caps 180a, 180b.

Figure 1C:
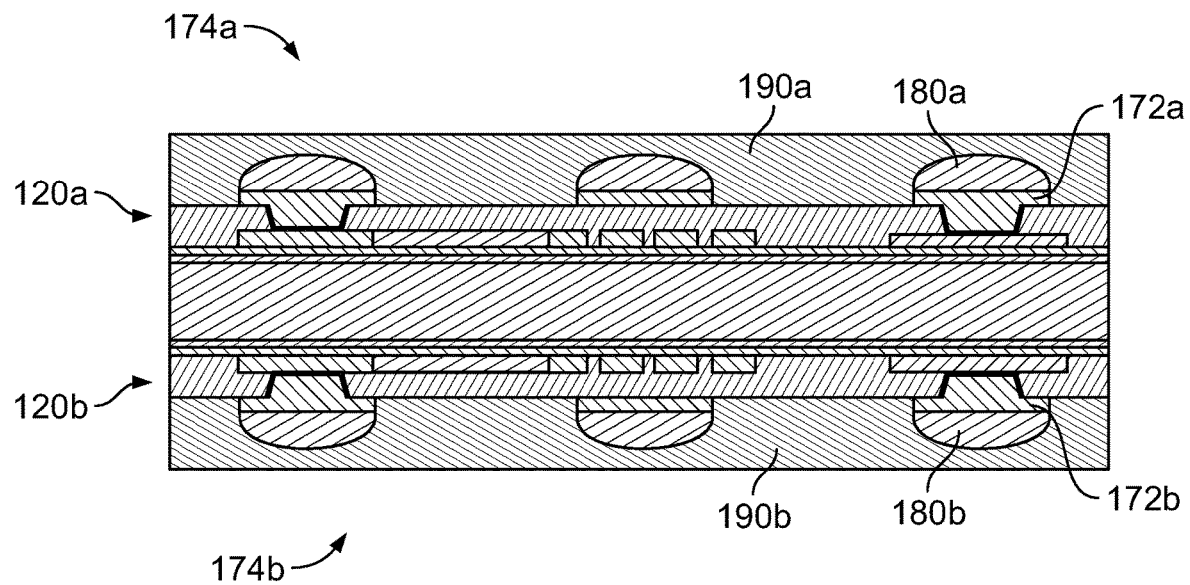

At FIG. 1C, the ball lands 172a, 172b of the arrays 174a, 174b and their respective presolder caps 180a, 180b are encapsulated. To this end, a mold layer 190a, 190b can be formed over the coreless substrates 120a, 120b, thereby covering the ball lands 172a, 172b and their respective presolder caps 180a, 180b in mold compound of the mold layer 190a, 190b. The mold layer 190a, 190b can be formed in any of a variety of manners (e.g., compression molding, transfer molding, flood molding, etc.). Moreover, the mold layer 190a, 190b can comprise a variety of types of mold compounds such as, for example, a polymer, an epoxy resin, or an epoxy acrylate, each of which including a filler material such as silica or other inorganic material. Mold layer 190a, 190b can also be referred as a stiffener layer. In some examples, a non-molded and/or filler-free dielectric stiffener layer can be used instead. For instance, such non-molded and/or filler-free stiffener layer 190a, 190b can comprise a hardened polymer or epoxy resin, such as an epoxy layer off an RCC (resin-coated-copper) film.

Dielectric stiffener layer 190a, 190b, whether molded or not as described above, is suitable for reducing warpage or increasing the overall structural integrity or stiffness of embedded ball land substrate 100a, 100b, in comparison to a substrate that lacks such stiffener layer or that just has an exposed solder-mask layer. In some implementations, whether molded or not, stiffener layer 190a, 190b can comprise Young's modulus of elasticity greater than the corresponding Young's modulus of coreless substrate 120a, 120b, and/or greater than the corresponding Young's modulus of dielectric layer 160a, 160b. For instance, the Young's modulus of stiffener layer 190a, 190b can be 3 GPa (gigapascals) or greater. In the same or other implementations, stiffener layer 190a, 190b can comprise coefficient of thermal expansion (CTE) lower than the corresponding CTE of coreless substrate 120a, 120b, and/or lower than the corresponding CTE of dielectric layer 160a, 160b. For instance, below Tg (glass transition temperature), the CTE of stiffener layer 190a, 190b can be approximately 1-19 ppm/° C.

Figure 1D:
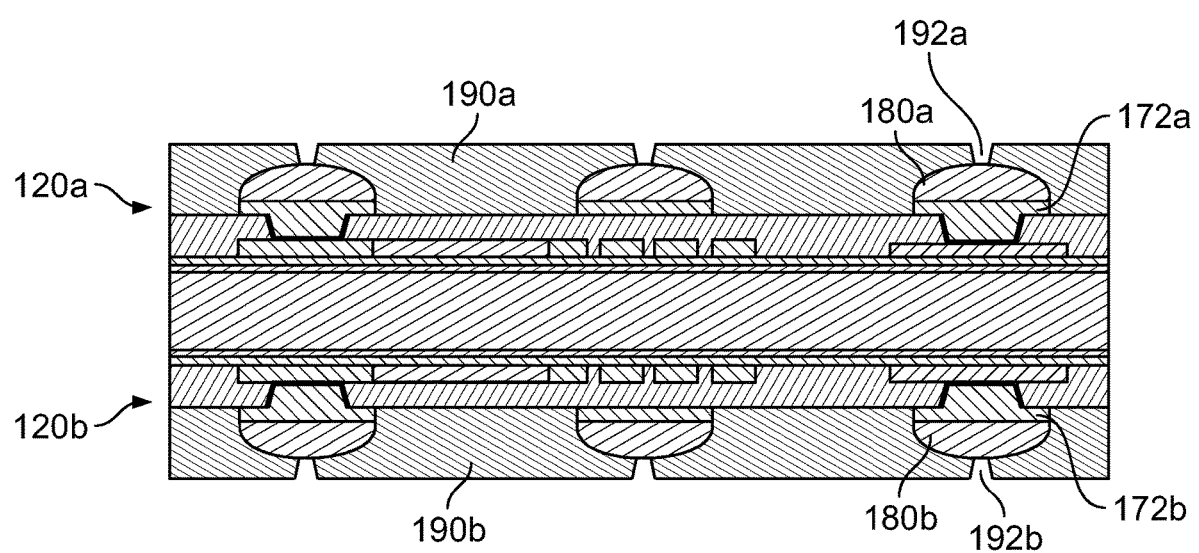

As shown in FIG. 1D, the mold layer 190a, 190b can include probe holes 192a, 192b. In particular, a probe hole 192a, 192b can be provided for each ball land 172a, 172b and/or its respective presolder cap 180a, 180b. Each probe hole 192a, 192b can provide a passage via which a test probe can electrically contact the respective ball land 172a, 172b and/or presolder cap 180a, 180b. Such probe holes 192a, 192b can be formed via a variety of different techniques such as, for example, laser drilling and chemical etching.

In some embodiments, each probe hole 192a, 192b can have diameter that is smaller than the diameter of its respective ball land 172a, 172b and more particularly can have a diameter that is less than half and/or less than a quarter of the diameter of its respective ball land 172a, 172b. As such, the mold layer 190a, 190b can generally cover the ball lands 172a, 172b for embodiments lacking the presolder cap 180a, 180b. Moreover, the mold layer 190a, 190b can cover side surfaces of the ball lands 172a, 172b and generally cover outer surfaces their respective presolder caps 180a, 180b for embodiments with presolder caps 180a, 180b. Thus, only a small portion of each ball land 172a, 172b and/or its presolder cap 180a, 180b is made accessible via the probe holes 192a, 192b. In particular, the mold layer 190a, 190b can extend over a majority of a surface area of the ball lands 172a, 172b and/or the presolder caps 180a, 180b.

Referring now to FIG. 1E, an embedded ball land substrate 100b is shown after its removal from the carrier 130. The embedded ball land substrate 100a can be fabricated and used in a similar manner to the embedded ball land substrate 100b. Accordingly, the following described aspects of the embedded ball land substrate 100b are also generally applicable to the embedded ball land substrate 100a.

The coreless substrates 120a, 120b of the embedded ball land substrates 100a, 100b can be released from the carrier 130 to obtain two separate embedded ball land substrates 100a, 100b. As explained above, the separation film 140a, 140b can include an adhesive that loosens when subjected to laser radiation and/or chemical agents. Thus, the adhesive can be subjected to the appropriate radiation, chemical agents, etc. to loosen the adhesive attachment between the coreless substrates 120a, 120b and the carrier 130. After the adhesive is loosened, the embedded ball land substrates 100a, 100b can be released from the carrier 130 to obtain two separate embedded ball land substrates 100a, 100b.

As shown in FIG. 1E, the embedded ball land substrate 100b, after its release from the carrier 130, can retain the mold layer 190b over the ball lands 172b and their respective presolder caps 180b. Such retained mold layer 190b can strengthen the embedded ball land substrate 100b, reduce warpage, and generally increase the overall structural integrity of the embedded ball land substrate 100b in comparison to a substrate without such a mold layer. In particular, the mold layer 190b can sufficiently strengthen the embedded ball land substrate 100b such that a semiconductor die can be attached to and packaged with the embedded ball land substrate 100b without the aid of a separate support carrier for the embedded ball land substrate 100b. In some examples, the mold layer 190b can comprise a thickness of 40-100 μm, (such as approximately 40 μm), to support and strengthen the coreless substrate 120b which could otherwise tend to warp due to its thinness and/or lack of core. In the same or other examples, the mold layer 190b can have a thickness greater than the thickness of coreless substrate 120b.

After the embedded ball land substrate 100b is removed or stripped from the carrier 130, a die attachment surface 102b of the embedded ball land substrate 100b can be finished. In particular, as shown in FIG. 1F, a solder resist layer 104b can be applied to the die attachment surface 102b of the embedded ball land substrate 100b. Finishing the die attachment surface 102b can also include strip routing, etching, cleaning, etc. depending upon the subsequent electrical test processes and die attachment processes to which the embedded ball land substrate 100b is to be subjected.

After the die attachment surface 102b is finished, the embedded ball land substrates 100a, 100b can undergo electrical testing. In particular, as shown in FIG. 1G, electrical probes 198 can be applied to each contact pad 126b and each ball land 172b (e.g., via its presolder cap 180b) of the embedded ball land substrate 100b. Voltage and/or current signals can be applied to such contact pads 126b and ball lands 172b to confirm electrical continuity between the contact pads 126b and ball lands 172b of the array 174b. In this manner, the electrical testing can confirm that embedded conductive traces 124b and conductive vias 162b of the coreless substrate 120b properly route signals between the contact pads 126b and ball lands 172b of the array 174b. In this manner, known "good" substrates and known "defective" substrates can be identified prior to attaching a semiconductor die to the respective substrate. Accordingly, waste associated with attaching semiconductor dies to defective substrates can be avoided or reduced.

In regard to FIGS. 1A-1G, the coreless substrates 120a, 120b of the embedded ball land substrates 100a, 100b have been described as having a single dielectric layer 160a, 160b. However, the coreless substrates 120a, 120b are not necessarily limited to a single dielectric layer structure. In some embodiments, the coreless substrates 120a, 120b can include multiple conductive layers and intervening dielectric layers. Such multi-layered structures can permit greater flexibility in routing signals between contact pads 126a, 126b and ball lands 172a, 172b via embedded conductive traces 124a, 124b and conductive vias 162a, 162b.

FIGS. 2A-2F provide cross-sectional views of an embodiment of a semiconductor device 200 fabricated from the embedded ball land substrate 100b of FIGS. 1A-1G in accordance with an example fabrication process of the present disclosure.

Figure 2A:
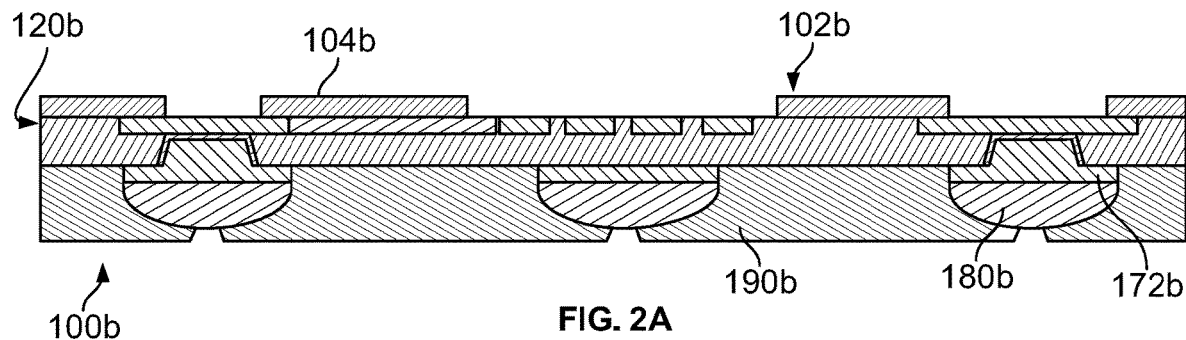
FIGS. 2A-2F provide cross-sectional views of an electronic device fabricated from the device of FIGS. 1A-1G in accordance with an example fabrication process of the present disclosure.

In particular, FIG. 2A depicts the embedded ball land substrate 100b of FIG. 1G after electrical testing. Since the embedded ball land substrate 100b of FIG. 2A has passed the electrical testing, the embedded ball land substrate 100b of FIGS. 2A-2E is known to be a good or validated component. As such, the embedded ball land substrate 100b can be also referred to as a known good substrate (KGS).

Figure 2B:
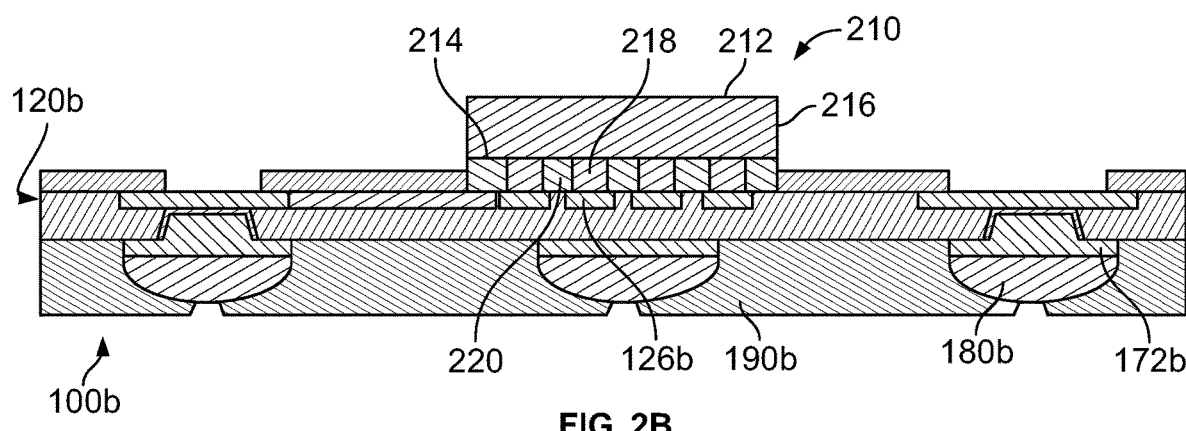

FIG. 2B depicts a semiconductor die 210 attached to the KGS or embedded ball land substrate 100b. The semiconductor die 210, for example, can comprise a variety of types of semiconductor die. For example, the semiconductor die 210 can comprise a digital signal processor (DSP), a microcontroller, a microprocessor, a network processor, a power management processor, an audio processor, a video processor, an RF circuit, a wireless baseband system-on-chip (SoC) processor, a sensor, an application specific integrated circuit, etc. One or more passive electrical components can also be mounted instead of and/or in addition to the semiconductor die 130.

As shown, the semiconductor die 210 can include a first surface 212, second surface 214 opposite the first surface 212, and one or more side surfaces 216 adjacent the first surface 212 and the second surface 214. Moreover, the one or more side surfaces 216 can adjoin the first surface 212 to the second surface 214.

As further shown, the second surface 214 can further include one or more conductive attachment structures 218 (e.g., a conductive bump). The conductive attachment structures 218 can electrically and physically connect the semiconductor die 210 to the contact pads 126b. To this end, each conductive attachment structure 218 can be attached to a respective pad 126b in any of a variety of manners. For example, each conductive attachment structure 218 can be soldered to a respective contact pad 126b utilizing any of a variety of solder attachment processes (e.g., a mass reflow process, a thermal compression process, a laser soldering process, etc.). Also for example, each conductive attachment structure 218 can be attached to a respective contact pad 126b utilizing a conductive adhesive, paste, etc. Additionally, for example, each conductive attachment structure 218 can be attached to a respective contact pad 126a utilizing a direct metal-to-metal (e.g., solderless) bond.

In an example scenario, a solder paste can be applied to the contact pads 126b utilizing a stencil and squeegee. The conductive attachment structures 218 can be positioned on or in the solder paste (e.g., utilizing a pick-and-place process), and the solder paste can then be reflowed. After attachment of the semiconductor die 210, the assembly can be cleaned (e.g., with hot de-ionized (DI) water, etc.), subjected to a flux clean and bake process, subjected to a plasma treatment process, etc.

In an example implementation, an underfill 220 can be formed between the semiconductor die 210 and the embedded ball land substrate 100b. In particular, the underfill 220 can surround exposed portions of the conductive attachment structures 218 and contact pads 126b, thereby encapsulating them in the underfill 220. The underfill 220 can comprise any of a variety of underfill materials. Also, the underfill 220 can be formed utilizing a variety of processes (e.g., a capillary underfilling process, utilizing a pre-applied underfill material, etc.). The underfill 220 between the semiconductor die 210 and the embedded ball land substrate 100b can prevent or reduce warpage, for example due to differences in thermal expansion coefficients of the semiconductor die 210 and the embedded ball land substrate 100b.

Figure 2C:
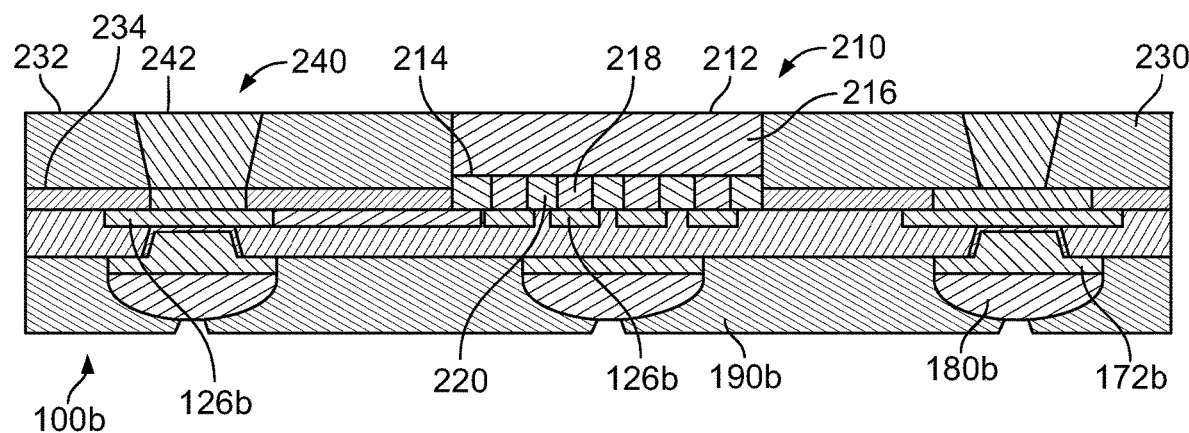

FIG. 2C depicts the semiconductor die 210 and embedded ball land substrate 100b after an encapsulating process. In particular, such an encapsulating process can form an encapsulant 230 over both the embedded ball land substrate 100b and the attached semiconductor die 210, thereby encapsulating the semiconductor die 210 and further securing the semiconductor die 210 to the embedded ball land substrate 100b. In an example embodiment, the encapsulant 230 can cover the side surfaces 216 and top surface 212 of the semiconductor die 210. In another example embodiment, the encapsulant 230 can cover the side surfaces 216 of the semiconductor die 210 (or only respective portions thereof), but can leave the top surface 212 of the semiconductor die 210 exposed as shown in FIG. 2C.

The encapsulant 230 can be formed in a variety of manners (e.g., compression molding, transfer molding, flood molding, etc.). Moreover, the encapsulant 230 can include a variety of types of encapsulating non-conductive materials. For example, the encapsulant 230 can comprise an epoxy, a thermosetting epoxy molding compound, a room temperature curing type compound, etc.

If the size of a filler (e.g., in inorganic filler or other particle component) of the encapsulant 230 is smaller than the gap between the embedded ball land substrate 100b and the semiconductor die 210, then a separate underfill material might not be utilized. Thus, in some embodiments, the encapsulant 230 can fill the gap between semiconductor die 210 and the embedded ball land substrate 100b. In such an embodiment, underfill 220 may be referred as a molded underfill, and/or the underfilling process and the encapsulating process can be combined into a single process that under fills and encapsulates the semiconductor die 210.

As further shown in FIG. 2C, encapsulant 230 can further include through mold vias 240. In particular, each through mold via 240 can pass between an upper surface 232 and a lower surface 234 of the encapsulant 230. Moreover, each through mold via 240 can include conductive material attached or in electrical contact with a respective contact pad 126b positioned about the periphery of the attached semiconductor die 210. To this end, a masking layer can be formed and patterned upon the upper surface 232 of the encapsulant 230. Holes or openings 242 can then be formed through the encapsulant 230 by etching the upper surface 232 of the encapsulant 230 in the presence of a patterned masking layer. The holes or openings 242 can be filled with a conductive material (e.g., via electroplating, electroless plating, a damascene process, etc.) to obtain through mold vias 240 in electrical contact with the contact pads 126b.

After the through mold vias 240 are formed, the upper surface 232 of the encapsulant 230 can be subjected to a planarization process such as a grinding process, a chemical mechanical polishing process, etc. The planarization process can remove the patterned masking layer (if present), portions of the encapsulant 230, and portions of the conductive material from the through mold vias 240. During such process, the upper surface 212 of the semiconductor die 210 can be used as a end point for stopping the process. As such, the planarization process can result in the upper surface 212 of the semiconductor die 210 being exposed and the upper surfaces of the semiconductor die 210, encapsulant 230, and through mold vias 240 being co-planar with one another.

Note that, although through mold vias 240 are described above as filled vias, there can be examples where through mold vias 240 can have a different structure or be formed otherwise. For instance, through mold vias 240 can be formed by attaching a metal pillar on contact pad 126b, by wirebonding a substantially vertical wire on contact pad 126b, or by attaching a pre-formed via structure, such as a PCB portion having a conductive via therein, over contact pad 126b. Encapsulating encapsulant 230 can then be carried out after such alternate formation of vias 240.

Figure 2D:
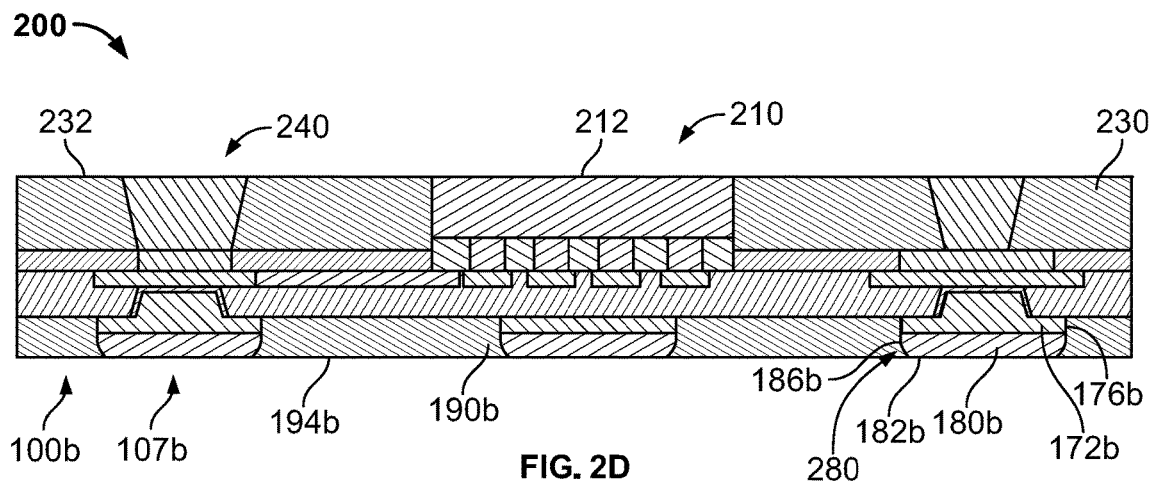

FIG. 2D depicts the semiconductor device 200 after the presolder caps 180b on the ball lands 172b are exposed. To this end, a lower surface 107b of the embedded ball land substrate 100b can be subjected to a planarization process such as a grinding process, chemical mechanical polishing process, etc. The planarization process can remove portions of both the presolder caps 180b and the mold layer 190b. In particular, the planarization process can remove at least enough of the mold layer 190b to remove the probe holes 192b and generally expose the presolder caps 180b. Furthermore, the planarization process can result in an exposed surface 182b of each presolder caps 180b and the exposed surface 194b of the mold layer 190b being generally planar and co-planar with one another. As further depicted, the planarization process can thin the mold layer 190b and reduce the overall thickness of the semiconductor device 200. For example, the mold layer 190b can be reduced to a thickness of approximately 1-50 µm, such as a thickness of approximately 30 µm. Thus, in some embodiments, the planarization process can reduce the thickness of the mold layer 190b by more than 50% of its original thickness and more preferably by more than 75% of its original thickness. In the same or other examples, the mold layer 190b can be reduced to a thickness at or less than 50% of the thickness of coreless substrate 120b.

The planarization process described for FIG. 2D can define, in mold layer 190b, the shape of a cap casing 280 that bounds presolder cap 180b. The shape of cap casing 280 can approximate a hemi-ellipsoidal segment, or a segment of a hemi-ellipsoid with an arcuate sidewall and delimited between parallel planes. For example, cap casing 280 is located over ball land 172b, and comprises a casing base across at least a portion of ball land 172b, a casing opening opposite the casing base and exposed by the mold compound of mold layer 190b, and a casing sidewall between the casing base and the casing opening, where an area of the casing base is greater than an area of the casing opening.

As shown, the ball lands 172b and respective presolder caps 180b remain embedded in the mold layer 190b after the planarization process. In particular, the retained mold layer 190b can continue to contact side surfaces 176b of the ball lands 172b and side surfaces 186b of presolder caps 180b. As such, the retained mold layer 190b can continue to aid in the overall structural integrity of the semiconductor device 200. In particular, the retained mold layer 190b can help support and protect the embedded ball lands 172b and embedded presolder caps 180b. For example, the retained mold layer 190b, in some embodiments, can help the semiconductor device 200 withstand physical impacts and/or thermal stresses resulting from subsequent transport, mounting, usage, etc. of the semiconductor device 200. The retained mold layer 190b can further help reduce warpage of the coreless substrate 120b due to, for example, thermal stresses.

Figure 2E:
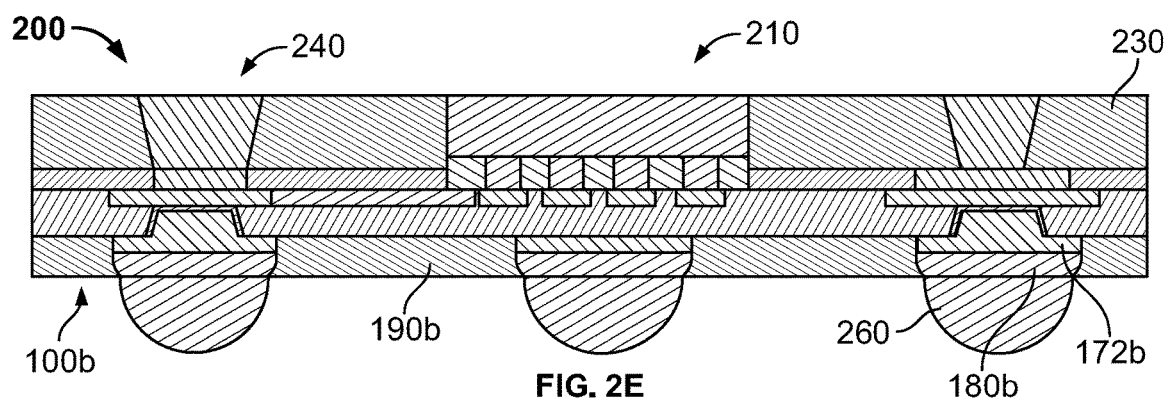

After such planarization, conductive balls 260 can be attached to the ball lands 172b via the presolder caps 180b as shown in FIG. 2E. The conductive balls 260 can comprise a variety of characteristics. For example, the conductive balls 260 can be formed of one of a eutectic solder (Sn37Pb), a high lead solder (Sn95Pb), a lead-free solder (SnAg, SnAu, SnCu, SnZn, SnZnBi, SnAgCu, and SnAgBi), combination thereof, equivalents thereof, etc. The conductive balls 260 can comprise, for example, a solder ball, a copper-core solder ball, etc. Moreover, the conductive balls 260 can be attached to the ball lands 172b utilizing a variety of processes. For example, the conductive balls 260 can be deposited (e.g., dropped, etc.) on the presolder caps 180b, and then a reflow temperature of the presolder caps 180b can be provided to reflow the presolder caps 180b and secure the conductive balls 260 to the ball lands 172b. The material or composition of conductive balls 260 can thus be different from that of presolder caps 180b, inclusive where both comprise respective solder materials of different types or different tin(Sn)-silver(Ag) composition.

The embedded ball land substrate 100b can be formed in a mass configuration (e.g., panel, strip, matrix, etc.) or as a single unit. In a scenario in which the embedded ball land substrate 100b is formed in a mass configuration, the embedded ball land substrate 100b and the encapsulant 230 can be singulated or cut (e.g., sawn by a diamond blade or laser beam, snap-separated, pull-separated, etc.). In such a scenario, the side surfaces 106b of the embedded ball land substrate 100b and side surfaces 236 of the encapsulant 230 can be made co-planar with one another by such a singulation process.

Figure 2F:
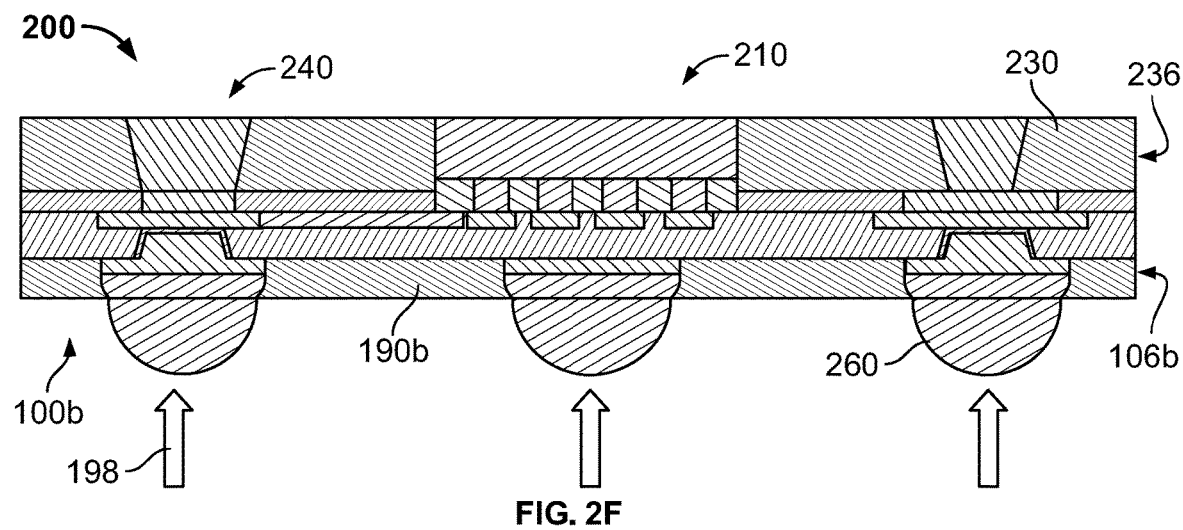

The completed semiconductor device 200 can undergo electrical testing. In particular, as shown in FIG. 2F, electrical probes 198 can be applied to each conductive ball 260. Voltage and/or current signals can be applied to the conductive balls 260 to confirm electrical continuity and/or functionality of the packaged semiconductor die 210.

FIGS. 3A-3G provide cross-sectional views of another embodiment of an embedded ball land substrate 101a, 101b fabricated in accordance with another example fabrication process of the present disclosure. The exemplary fabrication process for the embedded ball land substrates 101a, 101b is similar to the fabrication process depicted in FIGS. 1A-1E. As such, the following description focuses on those aspects that differ between the two fabrication processes.

Figure 3A:
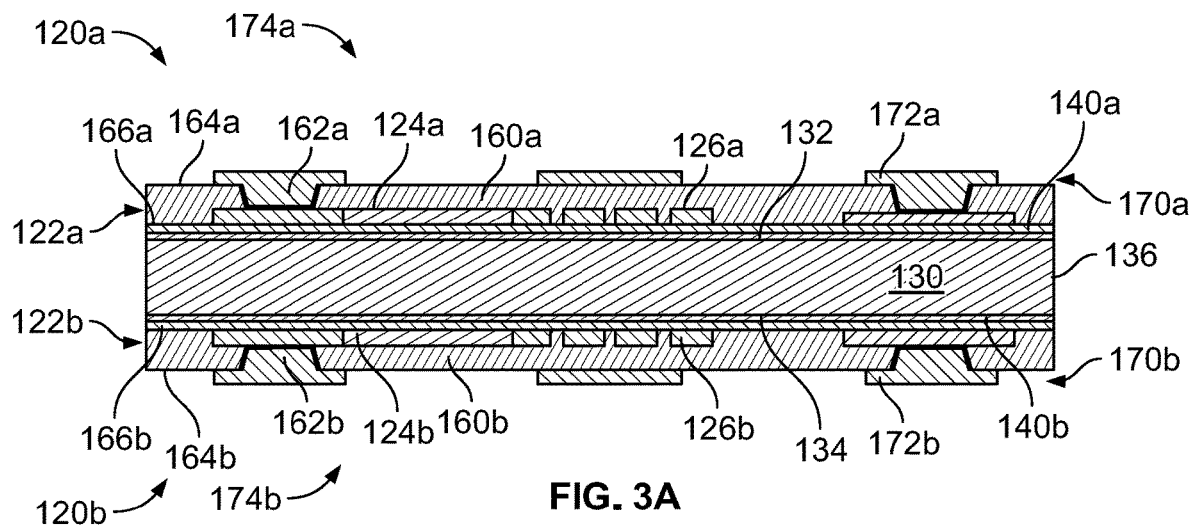
FIGS. 3A-3G provide cross-sectional views of an embodiment of an electronic device fabricated in accordance with an example fabrication process of the present disclosure.
Figure 3B:
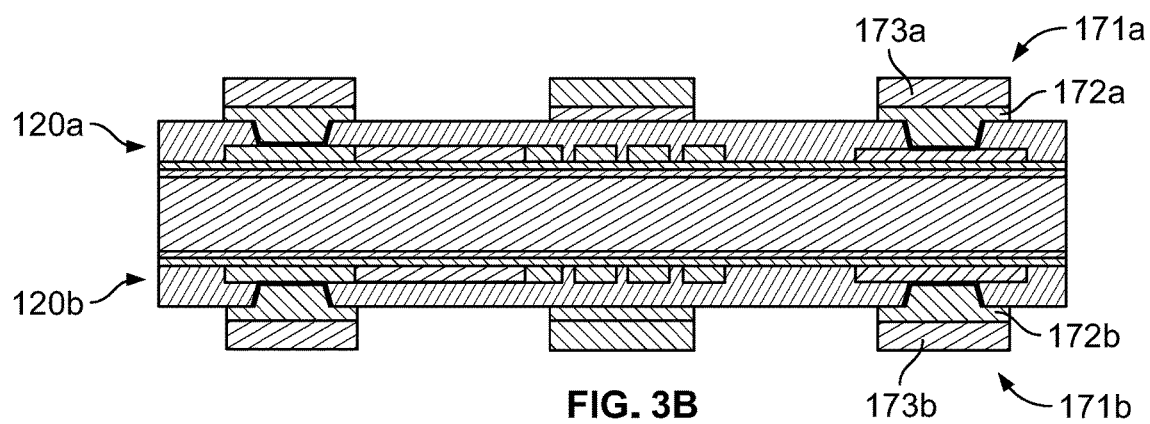

FIG. 3A depicts coreless substrates 120a, 120b formed on a carrier 130, which can be accomplished in the same manner as described above in regard to FIG. 1A. As seen in FIG. 3B, after the coreless substrates 120a, 120b are formed, ball land caps 173a, 173b can be formed on each ball land 172a, 172b of the coreless substrate 120a, 120b to obtain thicker ball lands 171a, 171b. In particular, the ball land caps 173a, 173b can be formed such that a separate ball land cap 173a, 173b is formed on each ball land 172a, 172b.

To this end, the ball land caps 173a, 173b can be formed on the ball lands 172a, 172b to a desired thickness. For example, the ball land caps 173a, 173b can be grown or formed from copper using copper plating techniques to a thickness range of 5-40 µm. As should be appreciated, the thickness of the ball land caps 173a, 173b is influenced by the planarization process used to remove a mold layer from the ball lands 171a, 171b during packaging of a semiconductor die 210 as described below with respect to FIGS. 4A-4F. Such planarization not only removes the mold layer from the ball lands 171a, 171b but also removes or thins the ball land caps 173a, 173b. As such, the ball land caps 173a, 173b can be grown to a thickness that ensures the ball lands 171a, 171b retain a sufficient thickness for attaching conductive balls 260 after the planarization. To this end, the ball land caps 173a, 173b can be grown to a thickness at least as thick as the ball lands 172a, 172b. In some embodiments, the ball land caps 173a, 173b are at least twice a thick as the ball lands 172a, 172b. Regardless, the embedded ball land substrates 101a, 101b have ball lands 171a, 171b that are thicker than the ball lands 172a, 172b of the embedded ball land substrates 100a, 100b of FIGS. 1A-1E.

Figure 3C:
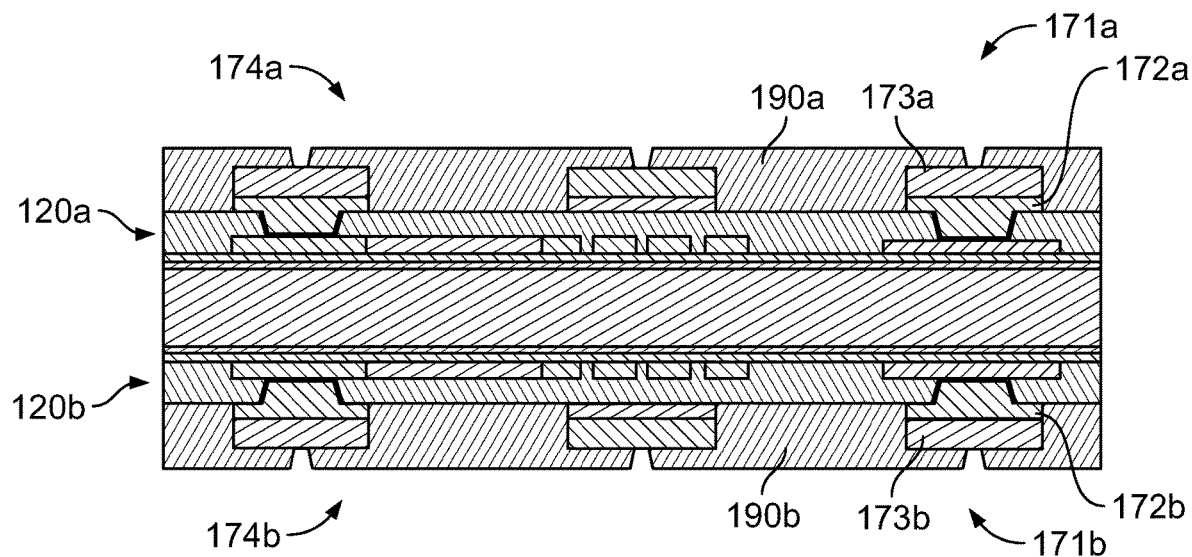
Figure 3D:
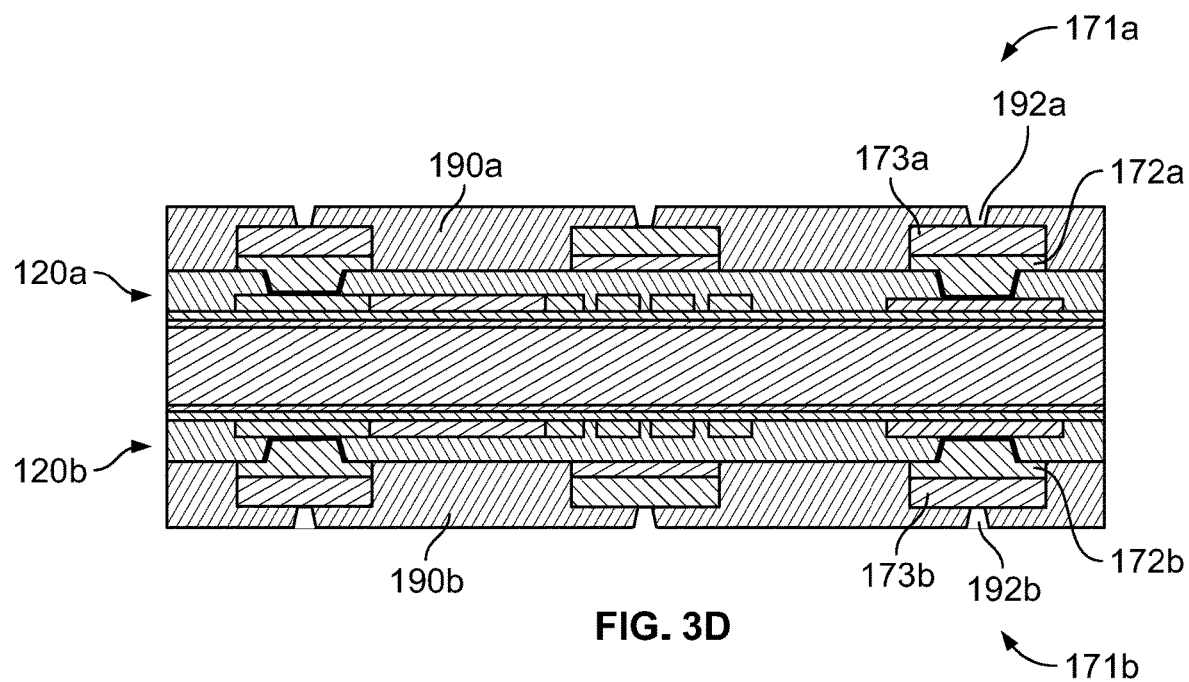

At FIG. 3C, the ball lands 171a, 171b of the arrays 174a, 174b are encapsulated in mold compound. To this end, a mold layer 190a, 190b can be formed over the coreless substrates 120a, 120b, thereby covering the ball lands 171a, 171b in a manner similar to the encapsulation process described above with respect to FIG. 1C. At FIG. 3D, probe holes 192a, 192b can be formed in the mold layer 190a, 190b in a manner similar to the process described above in regard to FIG. 1D.

Figure 3E:
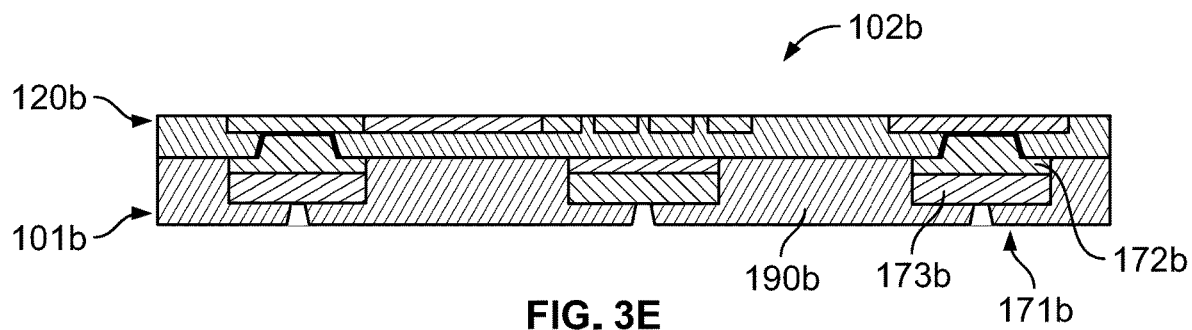

Referring now to FIG. 3E, the embedded ball land substrate 101b is shown after its removal from the carrier 130. The embedded ball land substrates 101a, 101b can be removed from the carrier 130 via a removal process that is similar to the removal process described above in regard to FIG. 1E. Moreover, the embedded ball land substrate 101a can be fabricated and used in a similar manner to the embedded ball land substrate 101b. Accordingly, the following described aspects of the embedded ball land substrate 101b are also generally applicable to the embedded ball land substrate 101a.

As shown in FIG. 3E, the embedded ball land substrate 101b, after its release from the carrier 130, can retain the mold layer 190b over the ball lands 171b, 171b. Such retained mold layer 190b can strengthen the embedded ball land substrate 101b, reduce warpage, and generally increase the overall structural integrity of the embedded ball land substrate 101b in comparison to a substrate without such a mold layer. In particular, the mold layer 190b can sufficiently strengthen the embedded ball land substrate 101b that a semiconductor die can be attached to and packaged with the embedded ball land substrate 101b without the aid of a separate support carrier for the embedded ball land substrate 101b.

Figure 3F:
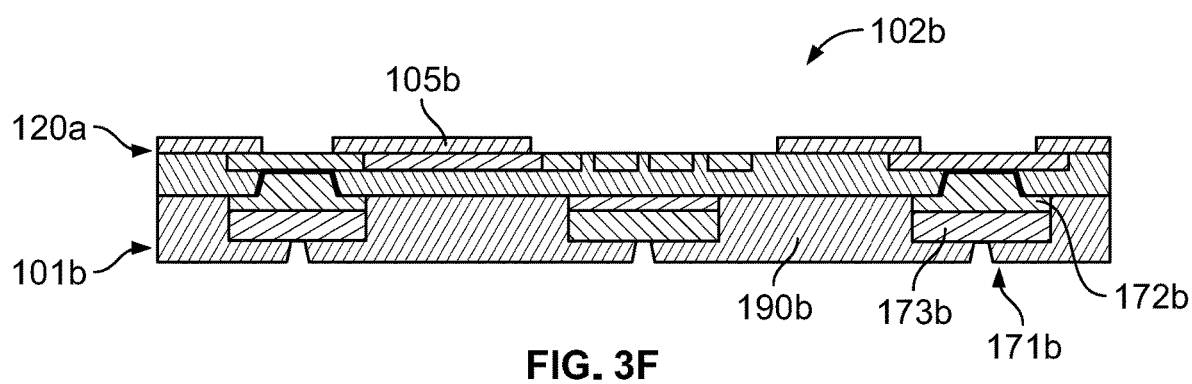

After the embedded ball land substrate 101b is removed or stripped from the carrier 130, a die attachment surface 102b of the embedded ball land substrate 100b can be finished. In particular, as shown in FIG. 3F, a ABF (Ajinomoto Build-up Film) film 105b or other insulative film can be applied to the die attachment surface 102b of the embedded ball land substrate 101b. Finishing the die attachment surface 102b can also include strip routing, etching, cleaning, etc. depending upon the subsequent electrical test processes and die attachment processes to which the embedded ball land substrate 101b is to be subjected.

Figure 3G:
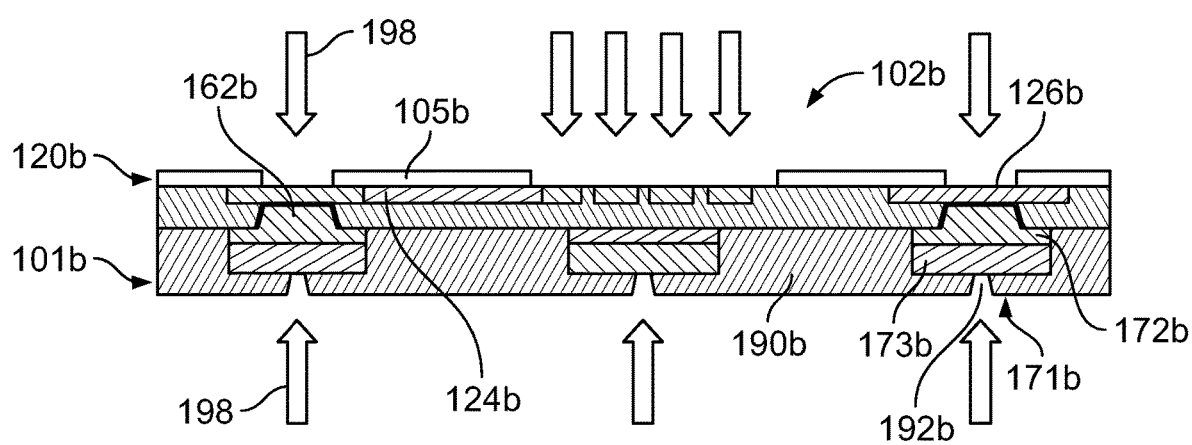

After the die attachment surface 102b is finished, the embedded ball land substrates 101a, 101b can undergo electrical testing. In particular, as shown in FIG. 3G, electrical probes 198 can be applied to each contact pad 126b and each ball land 171b, 171b of the embedded ball land substrate 101b. Voltage and/or current signals can be applied to such contact pads 126b and ball lands 171b to confirm electrical continuity between the contact pads 126b and ball lands 171b of the array 174b. In this manner, the electrical testing can confirm that embedded conductive traces 124b and conductive vias 162b of the coreless substrate 120b properly route signals between the contact pads 126b and ball lands 171b of the array 174b. In this manner, known "good" substrates and known "defective" substrates can be identified prior to attaching a semiconductor die to the respective substrate. Accordingly, waste associated with attaching semiconductor dies to defective substrates can be avoided or reduced.

Referring now to FIGS. 4A-4F, cross-sectional views are provided of another embodiment of a semiconductor device 201 fabricated from the embedded ball land substrate 101b of FIGS. 3A-3G in accordance with another example fabrication process of the present disclosure. The exemplary fabrication process for the semiconductor device 201 is similar to the fabrication process for the semiconductor device 200 depicted in FIGS. 1A-1E. As such, the following description primarily addresses those aspects that differ between the two fabrication processes.

Figure 4A:
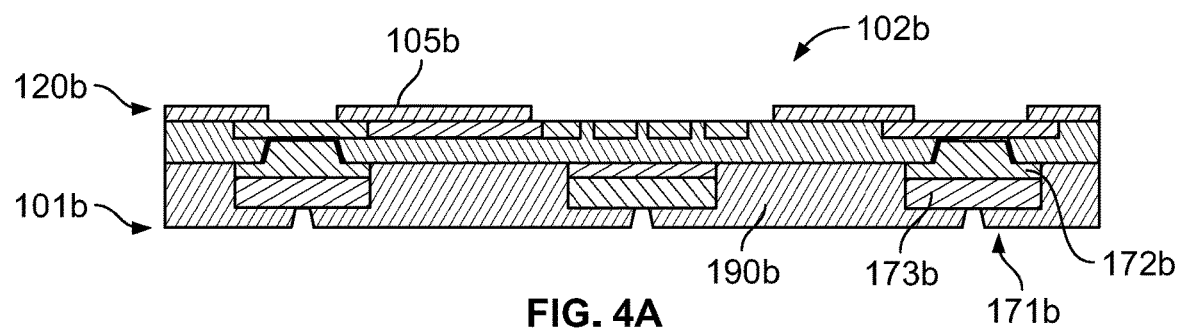
FIGS. 4A-4F provide cross-sectional views of an embodiment of a semiconductor device fabricated from the device of FIGS. 3A-3G in accordance with an example fabrication process of the present disclosure.

FIG. 4A depicts the embedded ball land substrate 101b of FIG. 3G after electrical testing. Since the embedded ball land substrate 101b of FIG. 4A has passed the electrical testing, the embedded ball land substrate 101b of FIGS. 4A-4E is known to be a good or validated component. As such, the embedded ball land substrate 101b can be also referred to as a known good substrate (KGS).

Figure 4B:
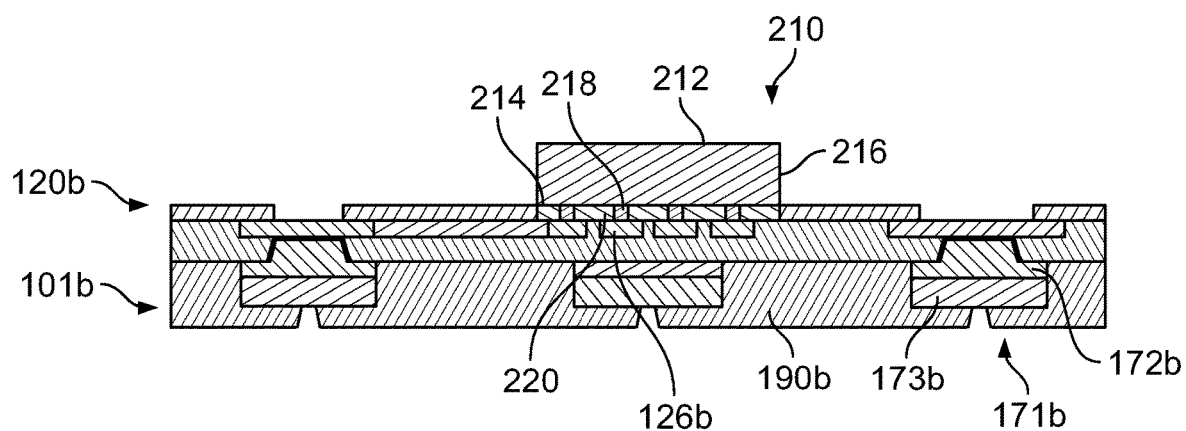

FIG. 4B depicts a semiconductor die 210 attached to the KGS or embedded ball land substrate 101b. The semiconductor die 210 can be attached to the embedded ball land substrate 101b per an attachment process that is similar to the attachment process described above in regard to FIG. 2B.

Figure 4C:
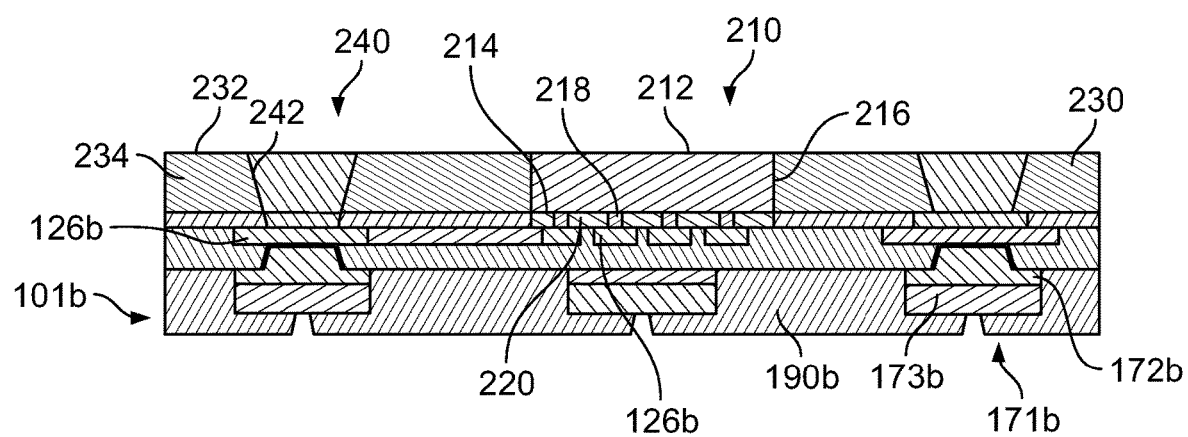

FIG. 4C depicts the semiconductor die 210 and embedded ball land substrate 101b after a molding process. In particular, such a molding process can form a encapsulant 230 over both the embedded ball land substrate 101b and the attached semiconductor die 210. Moreover, through mold vias 240 can be formed to extend through the encapsulant 230. The semiconductor die 210 and embedded ball land substrate 101b can be encapsulated in encapsulant 230 and the through mold vias 240 can be formed in a manner similar to the process described above in regard to FIG. 2C.

Figure 4D:
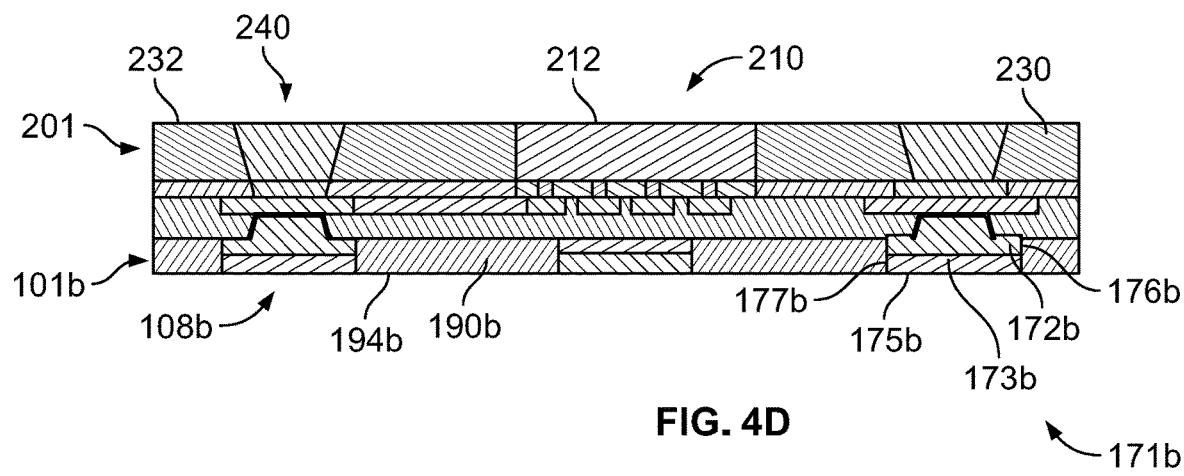

FIG. 4D depicts the semiconductor device 201 after the ball lands 171b are exposed. To this end, a lower surface 108b of the embedded ball land substrate 110b can be subjected to a planarization process such as a grinding process, chemical mechanical polishing process, etc. The planarization process can remove portions of the ball lands 171b and the mold layer 190b. In particular, the planarization process can remove at least enough of the mold layer 190b to remove the probe holes 192b and generally expose the ball lands 171b. Furthermore, the planarization process can result in an exposed surface 175b of each ball land 171b and the exposed surface 194b of the mold layer 190b being generally planar and co-planar with one another. As further depicted, the planarization process can thin the mold layer 190b and reduce the overall thickness of the semiconductor device 201. For example, the mold layer 190b can be reduced to a thickness at or less than 50 µm, such as for example to a reduced thickness or 5 µm to 30 µm, or a reduced thickness or approximately 15 µm. In some embodiments, the planarization process can reduce the thickness of the mold layer 190b by more than 50% of its original thickness. In the same or other examples, the mold layer 190b can be reduced to a thickness at or less than 50% of the thickness of coreless substrate 120b.

As shown, the ball lands 171b remain embedded in the mold layer 190b after the planarization process. In particular, the retained mold layer 190b can continue to contact side surfaces 176b of the ball lands 172b and/or side surfaces 177b of the ball land caps 173b. As such, the retained mold layer 190b can continue to aid in the overall structural integrity of the semiconductor device 201. In particular, the retained mold layer 190b can help support and protect the embedded ball lands 171b. For example, the retained mold layer 190b, in some embodiments, can help the semiconductor device 201 withstand physical impacts and/or thermal stresses resulting from subsequent transport, mounting, usage, etc. of the semiconductor device 201.

Figure 4E:
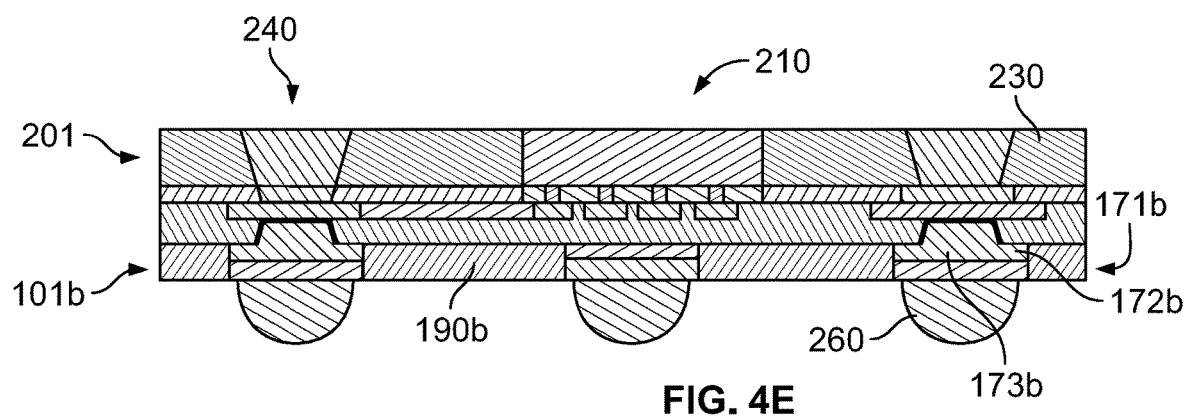

After such planarization, conductive balls 260 can be attached to the ball lands 171b as shown in FIG. 4E. The conductive balls 260 can be attached to the ball lands 171b utilizing a variety of processes. For example, the conductive balls 260 can be deposited (e.g., dropped, etc.) on the ball land 171b, and then a reflow temperature can be provided to reflow the conductive balls 260 and secure the conductive balls 260 to the ball lands 171b.

Similar to the embedded ball land substrate 100b, the embedded ball land substrate 101b can be formed in a mass configuration (e.g., panel, strip, matrix, etc.) or as a single unit. In a scenario in which the embedded ball land substrate 101b is formed in a mass configuration, the embedded ball land substrate 101b and the encapsulant 230 can be singulated or cut (e.g., sawn by a diamond blade or laser beam, snap-separated, pull-separated, etc.). In such a scenario, the side surfaces 106b of the embedded ball land substrate 101b and side surfaces 236 of the encapsulant 230 can be made co-planar with one another by such a singulation process.

Figure 4F:
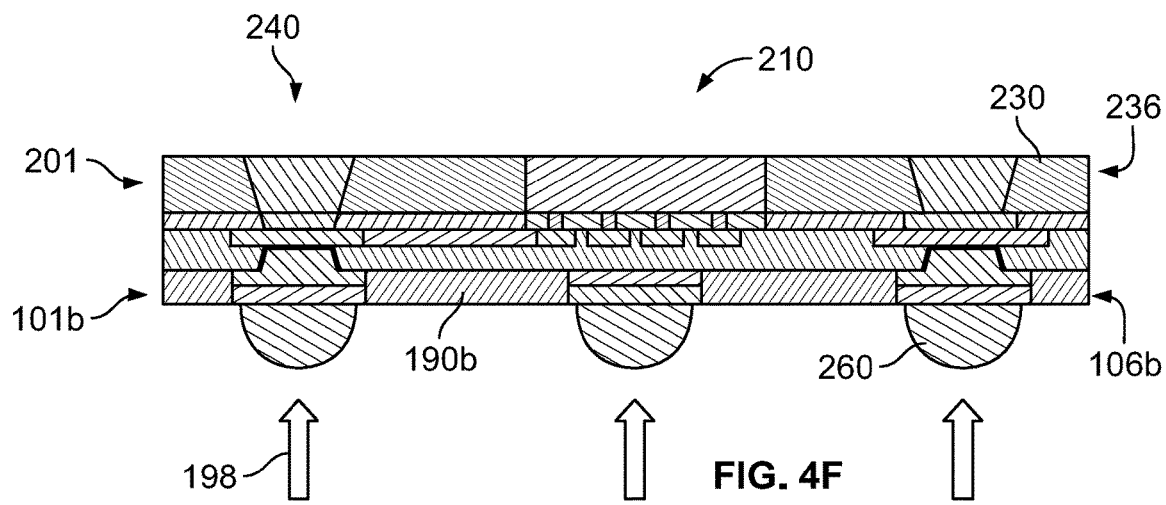

The completed semiconductor device 201 can undergo electrical testing. In particular, as shown in FIG. 4F, electrical probes 198 can be applied to each conductive ball 260. Voltage and/or current signals can be applied to the conductive balls 260 to confirm electrical continuity and/or functionality of the packaged semiconductor die 210.

The present disclosure provides exemplary embodiments. The scope of the present disclosure is not limited by these exemplary embodiments. Numerous variations, whether explicitly provided for by the specification or implied by the specification, such as variations in structure, dimension, type of material and manufacturing process, can be implemented by one skilled in the art in view of this disclosure.

What is claimed is:

1. A semiconductor device comprising:
an embedded ball land substrate comprising:
    a substrate top side,
    a substrate bottom side;
    first contact pads on the substrate top side;
    ball lands on the substrate bottom side;
    caps on the ball lands, wherein a sidewall of each cap comprises an arcuate surface that curves inwardly from a top side of the respective cap to a bottom side of the respective cap;
    conductive paths that couple the ball lands to the first contact pads; and
    a dielectric stiffener layer on the substrate bottom side, wherein the dielectric stiffener layer contacts sidewalls of the ball lands and sidewalls of the caps, and wherein the dielectric stiffener layer conforms to the arcuate surface of each cap;
a semiconductor die comprising a die top side, a die bottom side, and a die sidewall adjoining the die top side and the die bottom side;
attachment structures that couple the die bottom side to the first contact pads; and
an encapsulant that encapsulates and contacts the die sidewall and the substrate top side.

2. The semiconductor device of claim 1, wherein:
the dielectric stiffener layer comprises a stiffener layer bottom side and a stiffener layer top side coupled to the substrate bottom side;
each ball land has an associated probe hole in the stiffener layer bottom side; and
each probe hole has a diameter smaller than a diameter of its associated ball land.

3. The semiconductor device of claim 1, wherein:
the dielectric stiffener layer comprises a stiffener layer bottom side and a stiffener layer top side coupled to the substrate bottom side;
each cap has an associated probe hole in the stiffener layer bottom side; and
each cap is exposed to an environment external to the semiconductor device via its associated probe hole in the stiffener layer bottom side.

4. The semiconductor device of claim 1, wherein each cap comprises solder material.

5. The semiconductor device of claim 1, wherein each cap comprises a metal layer that is thicker than its associated ball land.

6. The semiconductor device of claim 1, wherein:
each cap comprises a cap bottom side; and
the dielectric stiffener layer contacts a majority of a surface area of each cap bottom side.

7. The semiconductor device of claim 1, further comprising an underfill between the die bottom side and the substrate top side.

8. The semiconductor device of claim 1, further comprising:
second contact pads on the substrate top side; and
conductive vias coupled to the second contact pads, wherein the conductive vias extend through the encapsulant to a top side of the encapsulant.

9. The semiconductor device of claim 1, further comprising conductive balls attached to the caps.

10. A semiconductor device, comprising:
an embedded ball land substrate comprising:
a substrate top side,
a substrate bottom side;
first contact pads on the substrate top side;
ball lands on the substrate bottom side;
caps on the ball lands;
conductive paths that couple the ball lands to the first contact pads; and
a dielectric stiffener layer on the substrate bottom side, wherein the dielectric stiffener layer contacts sidewalls of the ball lands and sidewalls of the caps;
conductive balls attached to the caps, wherein each conductive ball has a vertical height greater than a vertical height of its respective cap;
a semiconductor die comprising a die top side, a die bottom side, and a die sidewall adjoining the die top side and the die bottom side;
attachment structures that couple the die bottom side to the first contact pads; and
an encapsulant that encapsulates and contacts the die sidewall and the substrate top side.

11. The semiconductor device of claim 10, further comprising an underfill between the die bottom side and the substrate top side.

12. The semiconductor device of claim 10, wherein each cap comprises solder material.

13. The semiconductor device of claim 10, wherein each cap comprises a metal layer that is thicker than its associated ball land.

14. The semiconductor device of claim 10, wherein the sidewall of each cap comprises an arcuate surface that curves inwardly from a top side of the respective cap to a bottom side of the respective cap.

15. The semiconductor device of claim 14, wherein the dielectric stiffener layer conforms to the arcuate surface of each cap.

16. The semiconductor device of claim 10, further comprising:
second contact pads on the substrate top side; and
conductive vias coupled to the second contact pads, wherein the conductive vias extend through the encapsulant to a top side of the encapsulant.

17. A method of fabricating an electronic device, comprising:
providing a coreless substrate comprises:
a substrate top side;
a substrate bottom side;
contact pads on the substrate top side;
ball lands on the substrate bottom side;
caps on the ball lands; and
a dielectric stiffener layer on the substrate bottom side, wherein the dielectric stiffener layer contacts sidewalls of the ball lands and sidewalls of the caps, and wherein the dielectric stiffener layer extends over a majority of a surface area of a bottom side of each cap;
attaching a die bottom side of a semiconductor die to the contact pads;
forming an encapsulant that encapsulates and contacts the semiconductor die and the substrate top side;
planarizing the dielectric stiffener layer to expose the caps; and
attaching conductive balls to the caps exposed by planarizing the dielectric stiffener layer.

18. The method of claim 17, wherein planarizing the dielectric stiffener layer thins but retains the dielectric stiffener layer such that the dielectric stiffener layer remains in contact with the sidewalls of the ball lands and the sidewalls of caps after planarizing.

19. The method of claim 17, wherein attaching the die bottom side to the contact pads comprises attaching the die bottom side to the contact pads via attachment structures.

20. The method of claim 19, further comprising filling a space between the die bottom side and the substrate top side with an underfill.

* * * * *